United States Patent [19]
Apte et al.

[11] Patent Number: 5,475,607
[45] Date of Patent: Dec. 12, 1995

[54] METHOD OF TARGET GENERATION FOR MULTILEVEL HIERARCHICAL CIRCUIT DESIGNS

[75] Inventors: Jitendra Apte, Fishkill; Rajesh Gupta, Wappingers Falls, both of N.Y.

[73] Assignee: International Business Machines Corporation, Armonk, N.Y.

[21] Appl. No.: 226,603

[22] Filed: Apr. 12, 1994

[51] Int. Cl.$^6$ .................................................. G06F 17/50
[52] U.S. Cl. .................................... 364/489; 364/488
[58] Field of Search ...................... 364/488, 489, 364/490, 491, 578

[56] References Cited

U.S. PATENT DOCUMENTS

| | | | |
|---|---|---|---|
| 4,821,220 | 4/1989 | Duiberg | 364/578 |
| 5,095,454 | 3/1992 | Huang | 364/578 |
| 5,197,015 | 3/1993 | Hartoog et al. | 364/490 |
| 5,218,551 | 6/1993 | Agrawal et al. | 364/491 |
| 5,239,493 | 8/1993 | Sherman | 364/578 |
| 5,353,433 | 10/1994 | Sherman | 364/488 |
| 5,392,221 | 2/1995 | Donath et al. | 364/489 |
| 5,396,435 | 3/1995 | Ginetti | 364/489 |

OTHER PUBLICATIONS

W. K. Luk, "A Fast Physical Constraint Generator for Timing Drive Layout", 28th ACM/IEEE Design Automation Conference, Paper 37.3, Jun. 1991, pp. 626–631 (the Luk paper).
H. Youssef and E. Shragowitz, "Timing Constraints for Correct Performance", Proc. ICCAD, Nov. 1990, pp. 24–27 (the Youssef and Shragowitz paper).
W. E. Donath, "Wire Length Distribution for Placements of Computer Logic", IBM Journal of Research & Development, vol. 25, No. 3, May, 1981, pp. 152–155.
J. Rubinstein, P. Penfield, Jr., M. A. Horowitz, "Signal Delay in RC Tres Networks", IEEE Transactions on Computer–Aided Design, vol. CAD–2, No. 3, Jul. 1983.
F. K. Hwang, "On Steiner Minimal Trees with Rectilinear Distance", SIAM J. Appl. Math., vol. 14, No. 2, Mar. 1966).
R. B. Hitchcock, Sr., G. L. Smith and D. D. Cheng, in "Timing Analysis of Computer Hardware", IBM Journal of Research * Development, vol. 26, No. 1, Jan. 1982, pp. 100–105.
M. Hanan, "On Steiner's Problem with Rectilinear Distance", J. SIAM Appl. Match., vol. 14, No. 2, Mar. 1966).

*Primary Examiner*—Vincent N. Trans
*Attorney, Agent, or Firm*—Richard Lau; Alison D. Mortinger

[57] ABSTRACT

Generating delay targets for creating a multilevel hierarchical circuit design by providing a hierarchical design description and delay constraints of the circuit design; generating a net measure for each net and macro cell of the circuit design, and generating an abstract delay model for each macro cell of the circuit design based on the design description, wherein net measure is the estimated resistive-capacitive delay of a net derived from the estimated length of the net based on area-driven design, and an abstract delay model is a description of delays through a macro cell; generating delay targets for the nets and macro cells based on the net measures, the abstract delay models and the delay constraints; and creating the circuit design based on the delay targets.

12 Claims, 9 Drawing Sheets

METHOD OF TARGET GENERATION FOR MULTILEVEL HIERARCHICAL CIRCUIT DESIGNS

TECHNICAL FIELD

The present invention relates generally to methods of target generation for creating circuit designs and, more particularly, to such a method for creating a multilevel hierarchical circuit design.

BACKGROUND OF THE INVENTION

The goal of timing-driven layout, such as floorplanning, placement, wiring, etc., is to perform the layout design process such that the design satisfies the particular timing constraints specified by the designer. In the most general case, the timing constraint information is specified to the timing-driven layout tools in the form of arrival times for signals at the inputs of the design, and required arrival times for signals at the outputs of the design.

Timing-driven design tools generally deal with timing constraints in one of three ways or some variation thereof, namely, basing the design on path delay, net weight, or net delay. A net is an electrical connection of physical pins and/or logical input/output ports of electronic components.

Path delay based tools consider timing constraints on specified timing paths in the design, and perform the design process so as to satisfy these constraints. The constraints are generally in the form of maximum and/or minimum resistance-capacitance (RC) delay through a path. Theoretically, a timing constraint could be specified for every input-output path in the design. However, the number of such paths increases exponentially with the size of the design and, in practice, only a limited subset of paths can be effectively processed by conventional timing-driven tools. Thus, for large designs, it is impractical to monitor all paths in a design during the design process. In this regard, the cost can be reduced by monitoring a subgraph of the design containing several paths rather than monitoring the individual paths.

Net weight based methods consider weight factors for the nets. These weight factors indicate the relative importance of each net with respect to timing. Net weight based methods attempt to shorten nets having higher weights, thus reducing their delay, at the expense of other nets with lower weights. However, net weight based methods cannot guarantee meeting the overall timing constraints and, generally, must be run several times, adjusting the net weights with each run, in order to converge on the required timing for a particular design.

Net delay based tools consider targets, namely, resistance (R), capacitance (C) and resistance-capacitance (RC), on individual nets in the design and perform the design process so as to satisfy these targets. Typically, the individual net targets are generated based on the overall design constraints such that if every net target is met, the overall design will meet the timing goals. Net delay based approaches are able to monitor all nets in a design during the design process with relatively low computation cost. However, the effectiveness of the tool hinges on how the net targets are generated.

Existing target generation approaches apportion the delay specified on a path, which consists of several nets, as individual RC delay targets on the constituent nets. Generally, conventional target generation approaches follow the basic principles of target generation, but each may differ with respect to variations on the set of timing paths generated, and the way in which the delay on a path is apportioned to its constituent nets. See, for example, W. K. Luk, "A Fast Physical Constraint Generator for Timing Driven Layout", 28th ACM/IEEE Design Automation Conference, Paper 37.3, June 1991, pp. 626–631 ("the Luk paper"); and H. Youssef and E. Shragowitz, "Timing Constraints for Correct Performance", Proc. ICCAD, November 1990, pp. 24–27 ("the Youssef and Shragowitz paper").

In accordance with conventional target generation approaches, the input is the timing constraints on the design, and the output is the targets on the nets. Typically, the procedure begins by setting all initial targets on all nets to zero, and then proceeding with the following steps:

1. Run timing analysis on the logic network. This step takes into account the targets generated in the previous iteration of the repeat loop, and generates (i) a set of timing paths (each consisting of a sequence of timing nodes), and (ii) a slack value for each path. Slack is the amount of delay that can be added to a path without affecting the performance of the design;

2. Apportion the slack values on the paths to the nets contained in these paths. This step is carried out differently in different target generation approaches. In general, this step takes into account information such as existing targets on the nets, loading on the nets due to the cells they are connected to, the sensitivity of the net delays to changes in capacitance and resistance, etc.; and 3. Repeat steps 1 and 2 until all path slacks are zero or sufficiently near zero. In practice there may be an upper bound on the number of iterations after which the algorithm must exit. The targets on the nets thus generated are then passed on to placement/wiring programs.

Explained in another way, in essence, conventional target generation processes transform timing constraints on a design into timing constraints on the nets within the design, where the cells that are connected together by the nets are fixed predesigned entities (library cells or standard cells) that have known delays. This is illustrated in FIG. 1 which shows one critical path through a chip 10 from an input pin P1 to an output pin P2. The path is made up of six nets, n1–n6, and five standard cells, c1–c5. Assuming that there is a positive slack S on this path as determined by timing analysis, i.e., S units of delay can be added to this path without affecting the performance of the design, the target generation algorithms apportion the slack value S among the nets n1–n6, and accordingly modify the R, C and RC targets on these nets to reflect this apportionment. Note that this is a simple example with a single critical timing path. In general, there are many critical timing paths that intersect each other, and the targets assigned to a given net must be based on the slacks on all the timing paths to which it belongs.

Thus, conventional approaches for target generation work with "flat" designs in which the cells that the paths pass through are predesigned entities with fixed delays. However, in so-called multilevel hierarchical circuit designs, this condition may not hold since the cells themselves are made up of hierarchical entities whose internals have not yet been designed. Generally, a multilevel hierarchical circuit design refers to an electronic design whose representation has a containment hierarchy, i.e., the entire design is made up of a cell, which in turn contains child cells connected to each other by nets. Each cell is either a standard cell, which means that it is a predesigned cell taken from a standard cell library, or a macro cell, which means it contains one or more child cells. The children of macro cells may be standard cells or themselves macro cells. The current hierachy level refers to the particular level of design hierarchy at which the physical design is being carried out at a given time.

Referring to FIG. 2, in a multilevel hierarchical circuit design, there may be several levels of hierarchy between the top level entity of a design hierarchy, for example, chip 12, and the predesigned leaf level entities, for example, standard or library cells c6–c9, for which delay models are available. Thus, the top level entity or chip 12 of the hierarchy can be made up of macro cells, m1 and m2, that have not yet been designed. The lower-level cells c6–c9 (which may be standard cells or macro cells themselves) within the macro cells m1,m2 have not been placed and wired, and hence there are no fixed timing models available for the macro cells m1,m2. In order to use conventional techniques of target generation on the design of FIG. 2, the hierarchy would have to be "flattened", i.e., the boundaries of the hierarchical macro cells m1,m2 would have to be removed. Target generation could then be carried out on the flattened design to derive targets on the nets.

Existing target generation approaches described above cannot be used on multilevel hierarchical circuit design for several reasons, as follows:

1. Conventional target generation approaches assume that each cell in the design is a predesigned standard cell with fixed timing properties;

2. Even if target generation was carried out using conventional target generation on the flattened design, i.e., with the macro cell boundaries removed, the resulting net targets would not be directly useful. Specifically, the target assigned to any wire that crosses a macro cell boundary would still have to be apportioned to the two subnets, one outside and one inside the macro cell, because only the former is visible to a hierarchical floorplanner when it is working on the upper level of the hierarchy. For example, nets n7 and n8 in the hierarchical design illustrated in FIG. 2.

3. The floorplanning process being utilized would generally result in a layout in which nets within a macro cell have lower average length than nets crossing macro boundaries. Existing target generation approaches working on the "flattened" design would not take advantage of this to proportionately distribute wire delays.

Another disadvantage is that such flattening defeats the purpose of hierarchical design and requires the whole flattened design to be processed at once, which requires prohibitive amounts of memory and computation time for large designs. Further, in using this flattening approach, all nets are given equal weightage in "apportioning" delays among them, thus "local" nets, within macros such as m1, that have a lower average length cannot be distinguished from "global" nets across the whole chip that have a higher average length.

Accordingly, an improved target generation approach is required, particularly for multilevel hierarchical circuit designs.

SUMMARY OF THE INVENTION

Generally, the present invention relates to a method of generating delay targets (or budgets) for creating a multilevel hierarchical circuit design, comprising the steps of providing a hierarchical design description and delay constraints of the multilevel hierarchical circuit design, wherein the hierarchical design description describes the interrelationship between cells, including macro cells, input/output ports and nets in the multilevel hierarchical circuit design; generating a net measure for each net and macro cell of the multilevel hierarchical circuit design and generating an abstract delay model for each macro cell of the multilevel hierarchical circuit design based on the hierarchical design description, wherein net measure is the estimated resistive-capacitive delay of a net derived from the estimated length of the net based on area-driven design, and an abstract delay model is a description of delays through a macro cell; generating delay targets for the nets and macro cells based on the net measures, the abstract delay models and the delay constraints; and creating the multilevel hierarchical circuit design based on the delay targets.

BRIEF DESCRIPTION OF THE DRAWINGS

These and other features, aspects and advantages will be more readily apparent and better understood from the following detailed description of the invention, in which.

DETAILED DESCRIPTION OF THE PREFERRED EMBODIMENT

The term multilevel hierarchical circuit design as used herein is defined as a cell, known as the top-level cell, having data input and output ports at which data signals enter and exit the circuit design. The multilevel hierarchical circuit design is comprised internally of: (i) cells contained within the top-level cell, known as child cells of the top-level cell, the top-level cell being the parent cell of these child cells, and each child cell having its own input/output ports, and (ii) nets that provide electrical connections between the input/output ports of the child cells, as well as of the parent cell, wherein each child cell is either a standard or predesigned cell, or is itself comprised of its own child cells connected to each other by nets, in which case, it is known as a macro cell. Macro cell has the same definition as that of top-level cell.

Further, a quantity termed herein as "net measure" should be defined. Net measure of a net is the estimated resistive-capacitive delay of the net derived from the estimated length of the net based on conventional area-driven design, i.e., an estimate of what delay a net would have if the design of the cell that contains it was carried out to minimize area with no timing-driven influence. Note that when a timing-driven design process is carried out, even if two nets have the same net measure, the design process may force wire length to be traded off between them because one is more timing-critical than the other (i.e., the critical net will tend to be shorter, and thus have less delay).

The net measure associated with a driver-receiver port pair of a net is the predicted wire delay between the port pair resulting from conventional area-driven design. This can be estimated by well-known statistical techniques. See, for example, W. E. Donath, "Wire Length Distribution for Placements of Computer Logic", IBM Journal of Research & Development, Vol. 25, No. 3, May, 1981, pp. 152–155.

Figure 1:
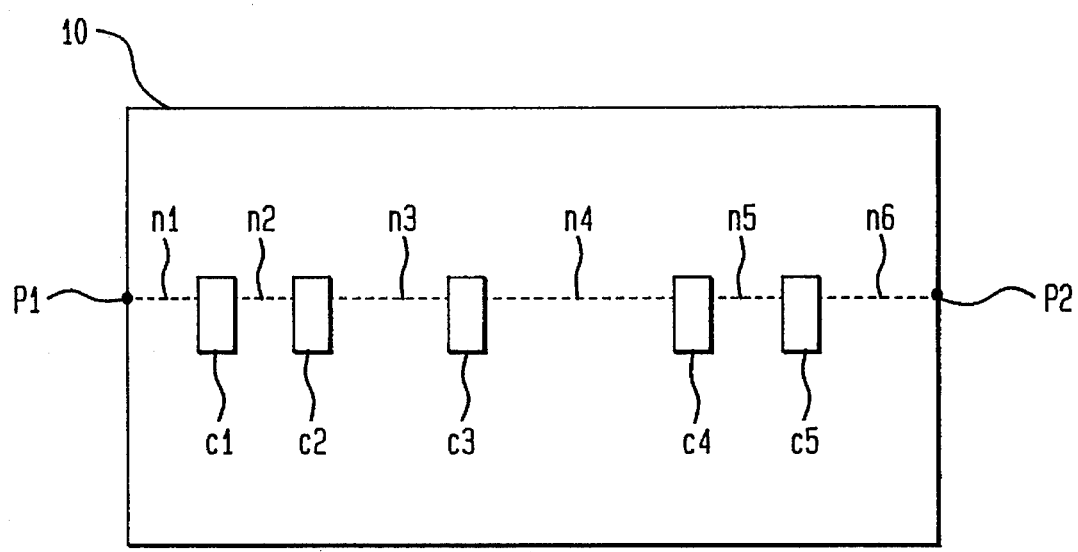
FIG. 1 shows a chip having a path from an input pin to an output pin.
Figure 2:
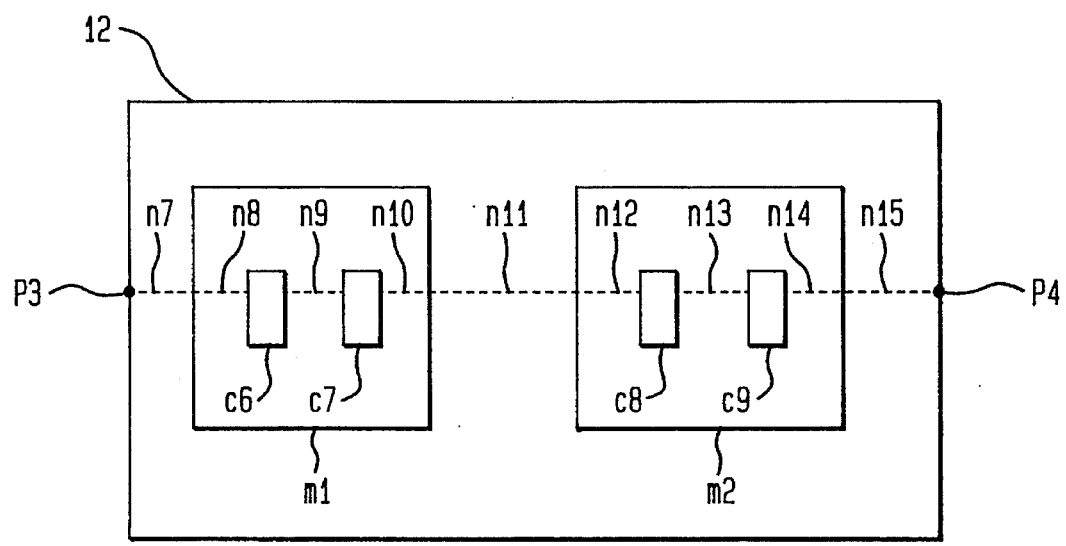
FIG. 2 shows a multilevel hierarchical circuit design.

The net measure of a path consisting of nets interconnected with standard cells is the sum of the net measures for the nets in the path. For example, consider the path consisting of nets n7–n15 in FIG. 2. Nets n9 and n13 have different net measures because they are predicted separately based on statistical formulas associated with macro cells m1 and m2, respectively. Further, the net measure of n7, n11 and n15 are determined separately based on statistical formulas applied to the top level cell, i.e., the chip 12. In general (but not necessarily), nets at the same level of the hierarchy within the same cell have the same estimated net measure. Thus, the net measure for the path from input P3 to output P4 in FIG. 2 is the sum of the net measures of net n7–n15.

If a path passes through a child macro cell, the net measure for the associated input-output port pair of the child macro cell must be determined and included in the path's net measure. The net measure for an input-output port pair of a macro cell is the cumulative net measure value along the longest delay path between the two ports.

The net measure for a port pair, $P_x, P_y$, which could be a source/sink port pair of a net or an input/output port pair of a macro cell, is denoted herein by the term $NM(P_x, P_y)$.

Net measures of nets and paths are used in target generation in accordance with the present invention. The method for computing the net measure is recursive. In other words, wherever a path passes through a macro cell, the net measure is first determined recursively for the macro cell and then used for the path.

Figure 3:
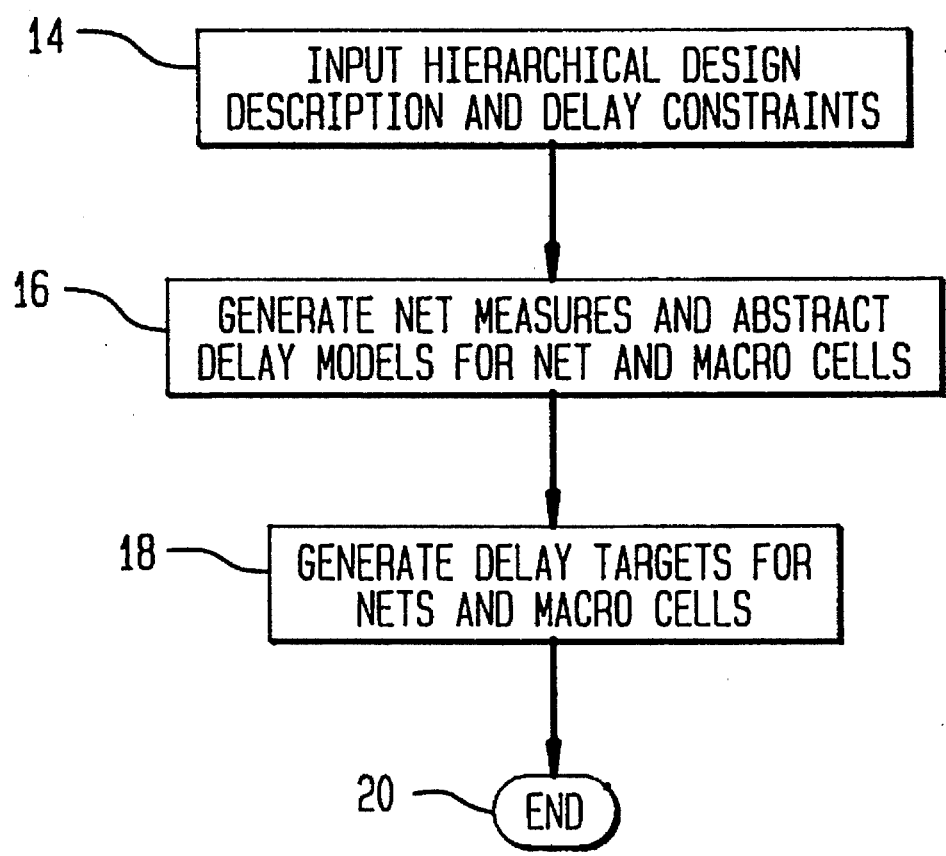
FIG. 3 is a high-level flowchart illustrating target generation in accordance with the present invention.

Referring now to FIG. 3, at block 14, in accordance with the present invention, the particular hierarchical design description and delay constraints of the multilevel hierarchical circuit design are the required inputs for generating delay targets for creating the multilevel hierarchical circuit design. The hierarchical design description describes the interrelationship between cells, including macro cells, ports and nets in the multilevel hierarchical circuit design. The leaf cells in the hierarchy of the design (i.e., the lowest-level child cells) are assumed to be standard cells or cells for which delay models are available. A delay model for a cell specifies the signal propagation delay for each input/output ("I/O") port pair of a cell, either as a constant value or as a function of the total capacitive load at the output port. It is assumed that standard cells that contain storage elements (latches or flip-flops) are identified in the input design as such, and such cells are referred to herein as latch cells, and the remainder are referred to as non-latch or combinational cells. The delay constraints are expressed in the form of:

1. signal arrival times ("AT's") at the primary inputs of the design, and the required arrival times ("RAT's") at the primary outputs of the design;
2. either sufficient information about the clocking scheme (such as clock period, latch setup/hold times, timing diagrams specifying clock signal relationships, etc.) for deriving the maximum allowed delay from any latch output to any latch input through non-latch combinational cells, or AT's at all latch outputs and RAT's at all latch inputs; and
3. optionally, AT's and RAT's specified at arbitrary internal points of the design as part of the delay constraints.

At block 16, a net measure is generated for each net and macro cell in the design hierarchy, and an abstract delay model is generated for each macro cell in the design hierarchy (excluding the top-level macro cell). An abstract delay model is a high-level description of the cumulative delays through a macro cell. Next, at block 18, delay targets are generated for the nets and macro cells in the design based on their relative net measure values, the abstract delay models of the macro cells, and the delay constraints. The process then ends at block 20. Detailed descriptions of blocks 16 and 18 are provided hereinbelow.

Each delay target generated takes the form of a time interval associated with a port pair of a net (source/sink) or macro cell (input/output); the time interval represents the maximum allowed propagation time for a signal between the two ports.

The delay targets generated for the nets and macros are passed, for example, to physical design tools. For each net in the design, its delay target can also (optionally) be converted into and expressed as a wire length target. State-of-the-art physical design tools (placement, wiring, etc.) are capable of performing the design process while attempting to meet such targets on net delays or lengths. If the physical design process succeeds in meeting the individual targets on all nets in the design, the entire hierarchical design is guaranteed to meet its overall delay constraints.

In effect, the hierarchical target generation process enables the physical design to be performed in a timing-driven manner, so as to meet the overall timing constraints by converting these overall timing constraints into delay targets on the individual design entities (nets and macro cells), which state-of-the-art physical design tools are capable of handling.

Figure 4:
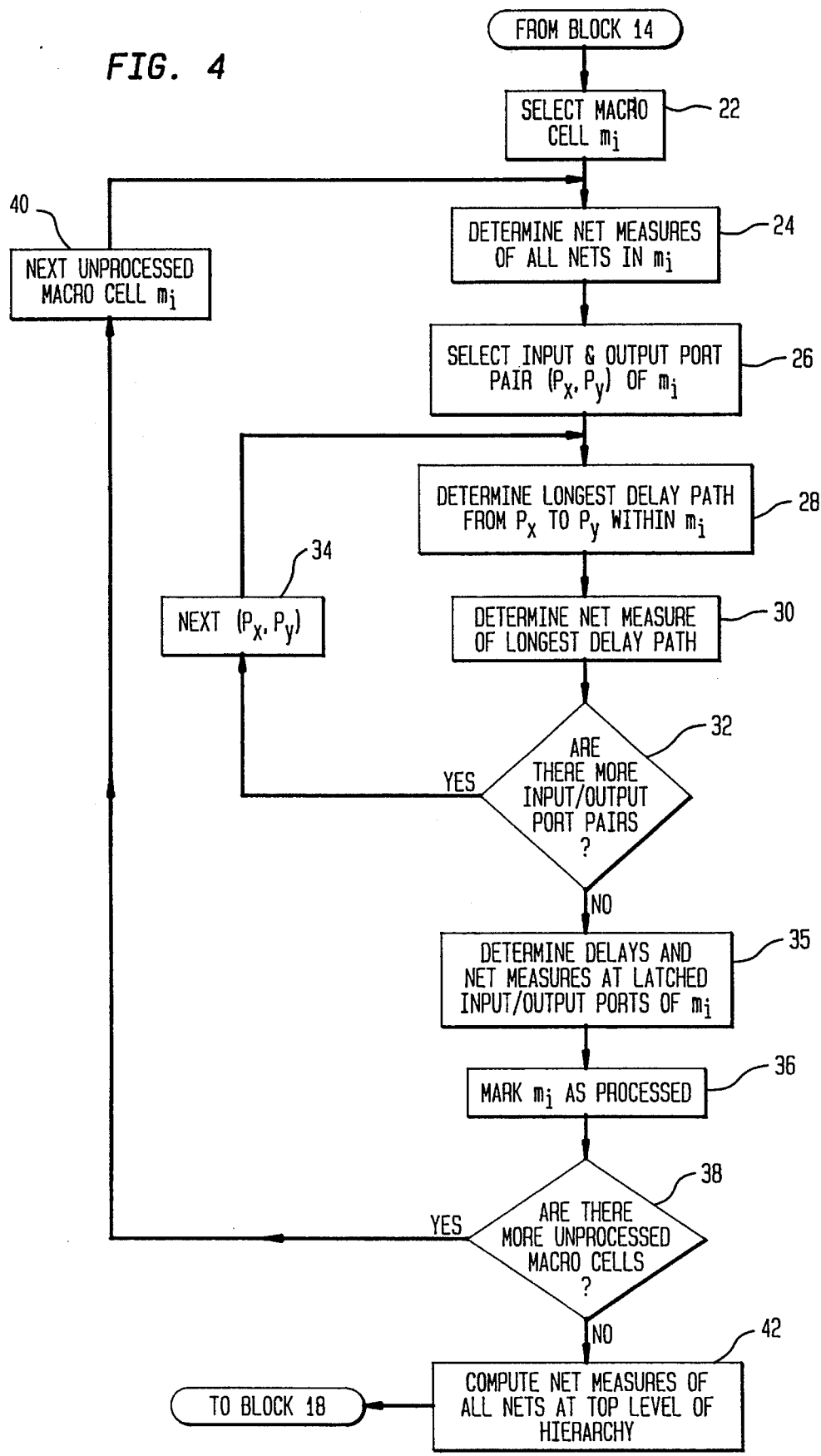
FIG. 4 is a flowchart illustrating generation of net measures and abstract delay models for nets and macro cells in accordance with block 16 of FIG. 3.

Details of block 16 for generating net measures and abstract delay models for nets and macro cells are shown in FIG. 4. The term "latched input port" as used herein refers to an input port of a macro cell for which there exists a path beginning at such input port, traversing nets and child cells at this level or at lower levels of the hierarchy, and ending at a latch or flip-flop. Similarly, the term "latched output port" is used herein analogously to the term "latched input port", except that "latched output port" refers to a path starting at a latch and ending at this port of the cell. Further, the term "combinational path" refers to a sequence of nets and non-latch cells in which, for every input/output port pair of a non-latch cell that the path passes through, there is a "delay segment", i.e., an associated delay value stored for that port pair in the delay model of the cell (which implies that a signal can propagate between those two ports). The term "path" is synonymous with "combinational path". The delay on a path consists of the sum of the delays along the nets and cells it passes through, plus the delay values on its beginning and ending ports, if any. With reference to FIG. 4, initially, a macro cell $m_i$ in the design is selected or accessed at block 22 such that all of its child cells are standard cells having predefined delay models. In general, macro cell $m_i$ (other than the top level cell) is selected and processed only when all its child macro cells (if any) have already been processed. This is essentially a bottom-up order of processing the macro cells.

Figure 5:
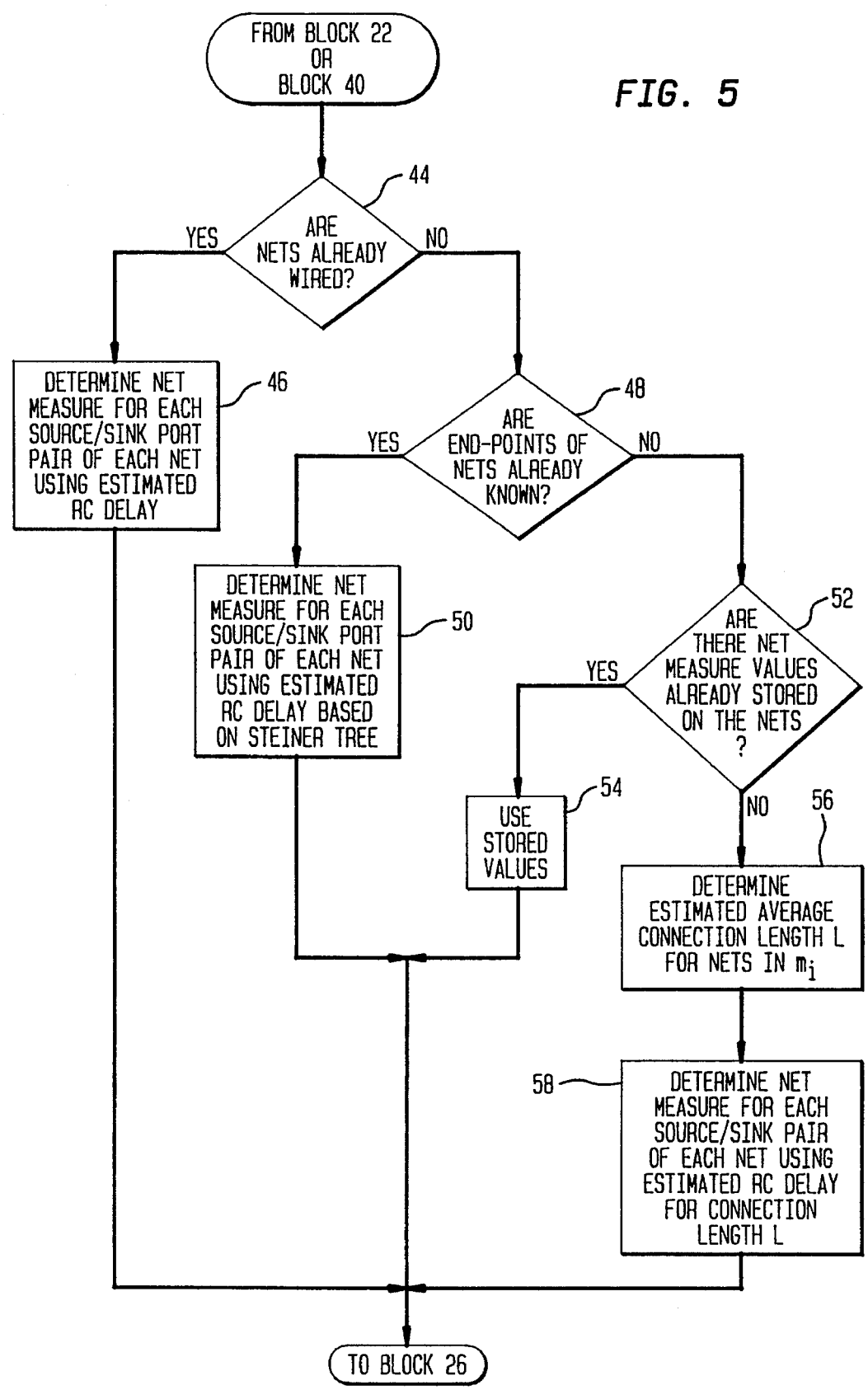
FIG. 5 is a flowchart illustrating determination of net measures of all nets in a macro cell in accordance with block 24 of FIG. 4.

At block 24, the net measures of all nets within the macro cell $m_i$ (i.e., the nets that interconnect the child cells of macro cell $m_i$) are determined. Reference is now made to FIG. 5, which provides a detailed method of determining net measures in accordance with block 24. The manner in which the net measures are determined depends on the state of the physical design process at the current hierarchy level. At block 44, it is determined if placement of the cells and wiring of the nets at the current level have already been carried out, i.e., it is determined if the net has a known path. If the answer is "YES", then every net already has a known path and, at block 46, the net measure for each connection (source-sink port pair) is determined as the RC (resistive-capacitive) delay for the wire path between the source and sink. This calculation can be performed by well known methods. See, for example, J. Rubinstein, P. Penfield, Jr., M. A. Horowitz, "Signal Delay in RC Tree Networks", IEEE Transactions on Computer-Aided Design, Vol. CAD-2, No. 3, July 1983. If wiring of the nets at the current level have not been carried out, then a determination is made at block 48 as to whether placement of the child cells has already been carried out, in which case the approximate locations of the end-points of the nets are already known. If the answer is "YES", then at block 50, a topology is first determined for each net, preferably in the form of a topology known as the Steiner tree (see, for example, F. K. Hwang, "On Steiner Minimal Trees with Rectilinear Distance", SIAM J. Appl. Math., Vol. 30, No. 1, January 1976; and, M. Hanan, "On Steiner's Problem with Rectilinear Distance", J. SIAM Appl. Math., Vol. 14, No. 2, March 1966), and the RC delays are then estimated for these topologies. If the approximate locations of the end-points of the nets are not already known, i.e., the answer to the determination at block 48 is "NO", then at block 52, a check is made to determine if there are previously stored or specified net measure values for the nets, in which case these values are utilized at block 54. This situation may arise if the entire target generation process is applied in an iterative manner. Finally, if no previous values are stored, an average connection length L is determined at block 56 for all the nets in the macro cell $m_i$ based on the physical and logical characteristics of the macro cell $m_i$. See, for example, W. E. Donath, "Wire Length Distribution for Placements of Computer Logic", IBM Journal of Research & Development, Vol. 25, No. 3, May, 1981, pp. 152–155, for discussion on such determination of average connection length. For this average connection length L, an RC delay is calculated at block 58 and used as a net measure value for all the nets. Every net measure determined for a source-sink port pair, $P_x, P_y$, of a net is stored as a net measure for the net, $NM(P_x, P_y)$.

Referring again to FIG. 4, blocks 26 through 34 constitute an inner iteration loop in which an abstract delay and a net measure are determined for every input/output port pair of macro cell $m_i$. Accordingly, an input/output port pair $(P_x, P_y)$ is selected at block 26. For the input/output port pair $(P_x, P_y)$, the longest-delay combinational path from $P_x$ to $P_y$ within the macro cell $m_i$ is determined at block 28. This path is selected among all combinational paths from $P_x$ to $P_y$ consisting of contiguous nets and non-latch cells. The delay along a path consists of the sum of the delays on its constituent nets and cells. The delay of a net is the net measure, which was determined at block 24, associated with the specific source and sink ports of the net that the path passes through. The delay of a cell depends on whether it is a standard cell or a macro cell. The delay of a standard cell, for the input/output port pair that the path of interest passes through, is available in the form of a delay model which was input at block 14. The delay through a macro cell is obtained from the abstract delay model which should have been determined in an earlier iteration of the loop for the macro cell $m_i$. Thus, the longest-delay path from $P_x$ to $P_y$ can be derived using conventional graph-theoretic methods on a directed graph whose vertices represent the ports of the macro cell $m_i$ and each of whose arcs (labeled with delay values corresponding to arc length) represents either a source-sink connection in a net or an input-output signal propagation through a cell. If such a path $PC_{xy}$ exists between $P_x$ and $P_y$, the delay on $PC_{xy}$ is stored as a delay segment of the abstract delay model of the macro cell $m_i$ as Delay$(P_x, P_y)$.

Next, at block 30, the portion of the delay along the longest delay path $PC_{xy}$ that was determined at block 28 that is due to net delays is determined. This is determined by traversing the longest path $PC_{xy}$, if any, and adding up the net measures $NM(P_a, P_b)$ for the port pairs $(P_a, P_b)$ of the nets and macro cells in the path. This value is stored as the net measure value between ports $P_x$ and $P_y$ of the macro cell $m_i$ as $NM(P_x, P_y)$.

More specifically, for a cell that has only standard library cells as its children, the net measure from a given input port to a given output port is the sum of the net measures of the source-sink connection pairs of the nets in the longest delay path between the two ports. For example, referring to FIG. 6A, assuming that the longest delay path between ports P5 and P6 is made up of nets n16, n17, n18, n19 and n20, then the net measure between port P5 and port P6 is the sum of the net measures of the such nets. Referring to FIG. 6B, for a cell that has macro cells within it, i.e., there are child cells that are not themselves standard library cells, the longest delay path may pass through macro cells, for example macro cell m3. In this case, the net measure is defined in a slightly modified manner. If the longest path between port P7 and port P8 is made up of nets n21, n22, n23 and n24, and the path between ports P9 and P10 of the macro cell m3, then the net measure between ports P7 and P8 is the sum of the net measures of these nets n21, n22, n23 and n24, as well as the net measure between ports P3 and P4 of the macro cell m3. Thus, the net measure in such a case is defined as the sum of the net measures of the nets as well as of the macro cells that the longest-delay path passes through, as indicated above.

Figure 6A:
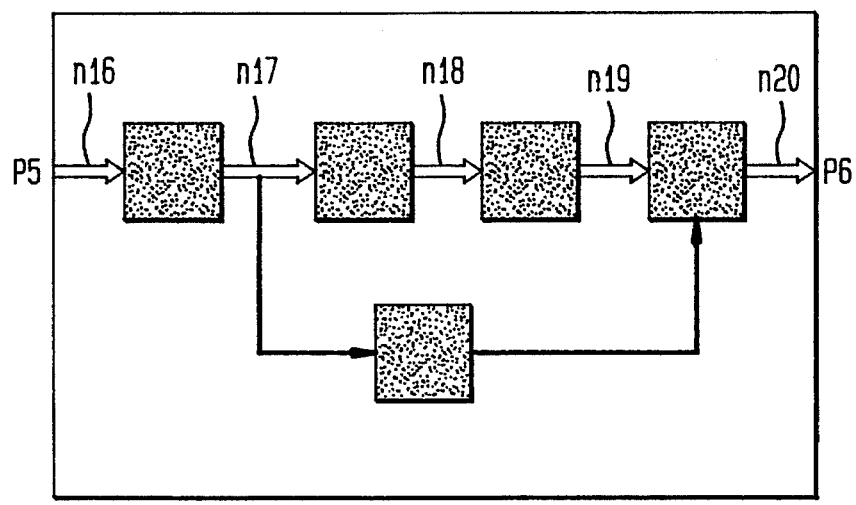
FIG. 6A shows a cell having an input port and an output port and the longest delay path therebetween.
Figure 6B:
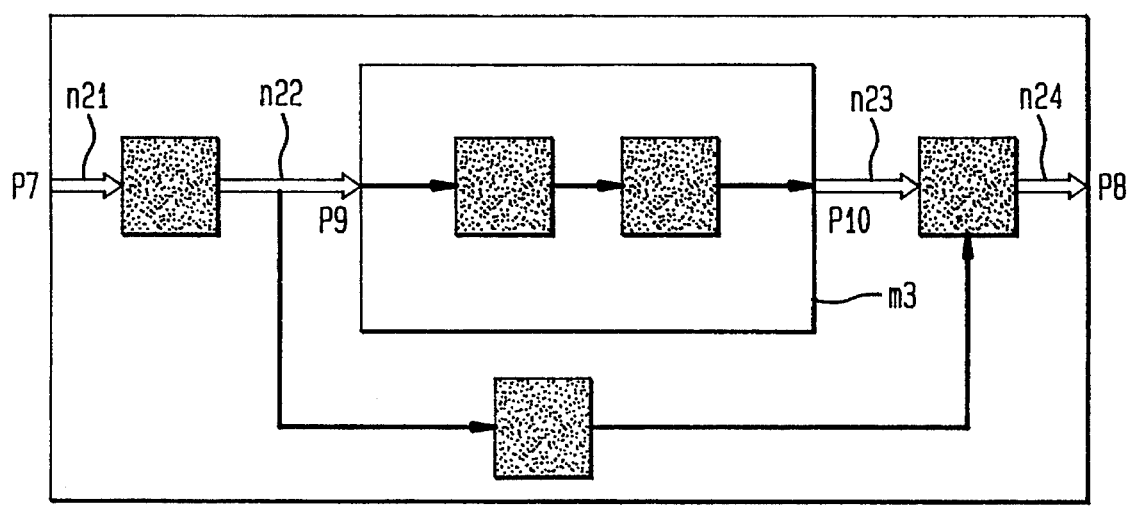
FIG. 6B shows a cell having a macro cell therein, and an input port and an outport port, with the longest delay path therebetween.

As evident from FIGS. 6A and 6B, net measure is defined recursively for a hierarchical design. In other words, the net measure of a macro cell (between a given pair of its ports) depends on the net measures of its child cells that are macro cells, hence the latter needs to be determined first. Thus, the computation of net measures needs to be carried out in a bottom-up traversal of the hierarchy.

Referring again to FIG. 4, subsequent to determining the net measure of the longest delay path at block 30, a determination is then made at block 32 as to whether or not there are more input/output port pairs of $m_i$ that need to be processed. If there are more input/output port pairs that need to be processed, then the next input/output port pair is accessed at block 34, and processing in accordance with blocks 28–32 continues. However, if there are no more input/output port pairs that need to be processed, then an abstract delay value and a net measure value are now available (if they exit) for every input/output port pair of the macro cell $m_i$. In addition, a net measure value is available for every source/sink port pair of every net in the macro cell $m_i$.

Delay segments and net measures have thus been determined for all I/O ports pairs of the macro cell $m_i$ that are connected by combinational logic. Next, at block 35, the delays and net measure values are determined for I/O ports of macro cell $m_i$ that are connected to latches.

Figure 7:
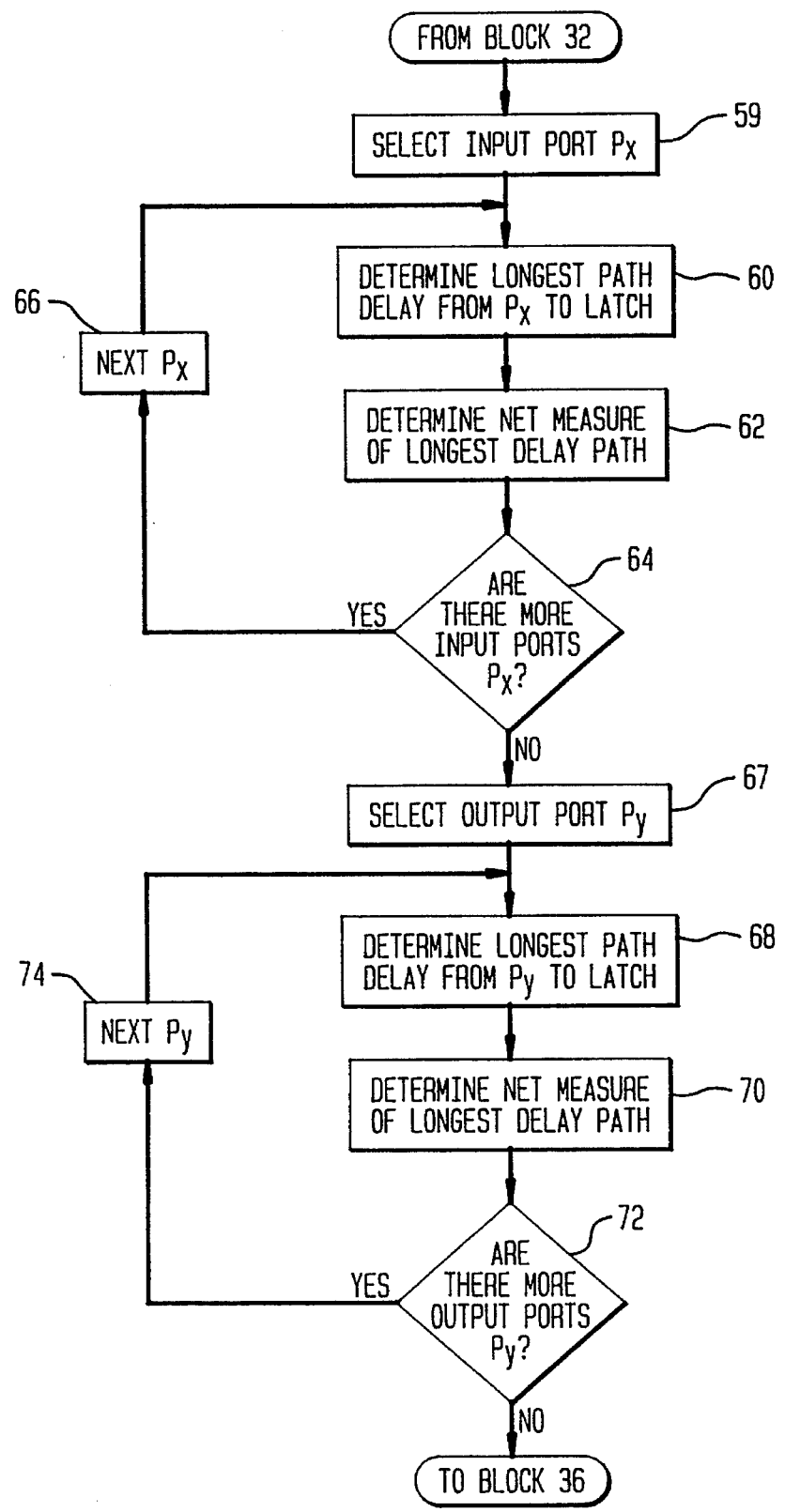
FIG. 7 is a flowchart illustrating determination of delays and net measures at latched input/output ports of a macro cell in accordance with block 35 of FIG. 4.

Reference is now made to FIG. 7, which provides a detailed method of determining delays and net measures in accordance with block 35. The delay data for the latched input and output ports of macro cell $m_i$ must be determined. At block 59, an input port $P_x$ of $m_i$ is selected. At block 60, the longest delay combinational path $PC_x$, if any, is determined. This combinational path $PC_x$ is a path from the input port $P_x$ to either a data input port of a child latch cell of macro cell $m_i$, or a latched input port of a macro child cell of macro cell $m_i$. If such a combinational path $PC_x$ is found, then $P_x$ is itself a latched input port of macro cell $m_i$. In such case, a value Delay($P_x$) is stored in the abstract delay model of macro cell $m_i$, and consists of the delay on $PC_x$, if $PC_x$ ends at a latch cell, or the delay on $PC_x$ plus the previously stored value Delay($P_a$) if $PC_x$ ends at a latched input port $P_a$ of a macro cell. In both cases, Delay($P_x$) represents the total delay from $P_x$ to the latch within $m_i$ that is "farthest" from it in the delay sense.

At block 62, if a path $PC_x$ was found at block 60, then the net measure values along this path are added together, along with the value of NM($P_a$) if $PC_x$ ends at a latched input port $P_a$, and stored as NM($P_x$). Next, if it is determined at block 64 that there are more input ports $P_x$ for which delay data must be determined, then the next $P_x$ is accessed at block 66, and processing continues to block 60. However, if it is determined at block 64 that there are no more input ports $P_x$ for which delay data must be determined, the procedure continues to block 68. At block 67, an output port $P_y$ of $m_i$ is selected. At blocks 68 and 70, similarly to blocks 60 and 62 for input ports $P_x$, for each latched output port $P_y$ of the macro cell $m_i$, the longest delay combinational path $PC_y$, if any, is determined and stored as Delay($P_y$) in the abstract delay model of macro cell $m_i$, and a net measure value NM($P_y$) is also stored for macro cell $m_i$.

Referring again to FIG. 4, the macro cell $m_i$ is then marked as processed at block 36.

A determination is then made at block 38 as to whether there are any macro cells $m_i$ other than the top level cell that were not processed. If it is determined at block 38 that there are more macro cells $m_i$ that need to be processed, then another such unprocessed macro cell is accessed or selected at block 40, and processing continues. However, if it is determined at block 38 that there are no more macro cells that need to be processed, then the procedure continues to block 42.

At the point when the procedure reaches block 42, net measures have been determined for all nets and macro cells in the design hierarchy, except the nets at the top hierarchy level. At block 42, the net measures are now determined for these nets using the same procedure as outlined for block 24 in conjunction with FIG. 5.

Figure 8:
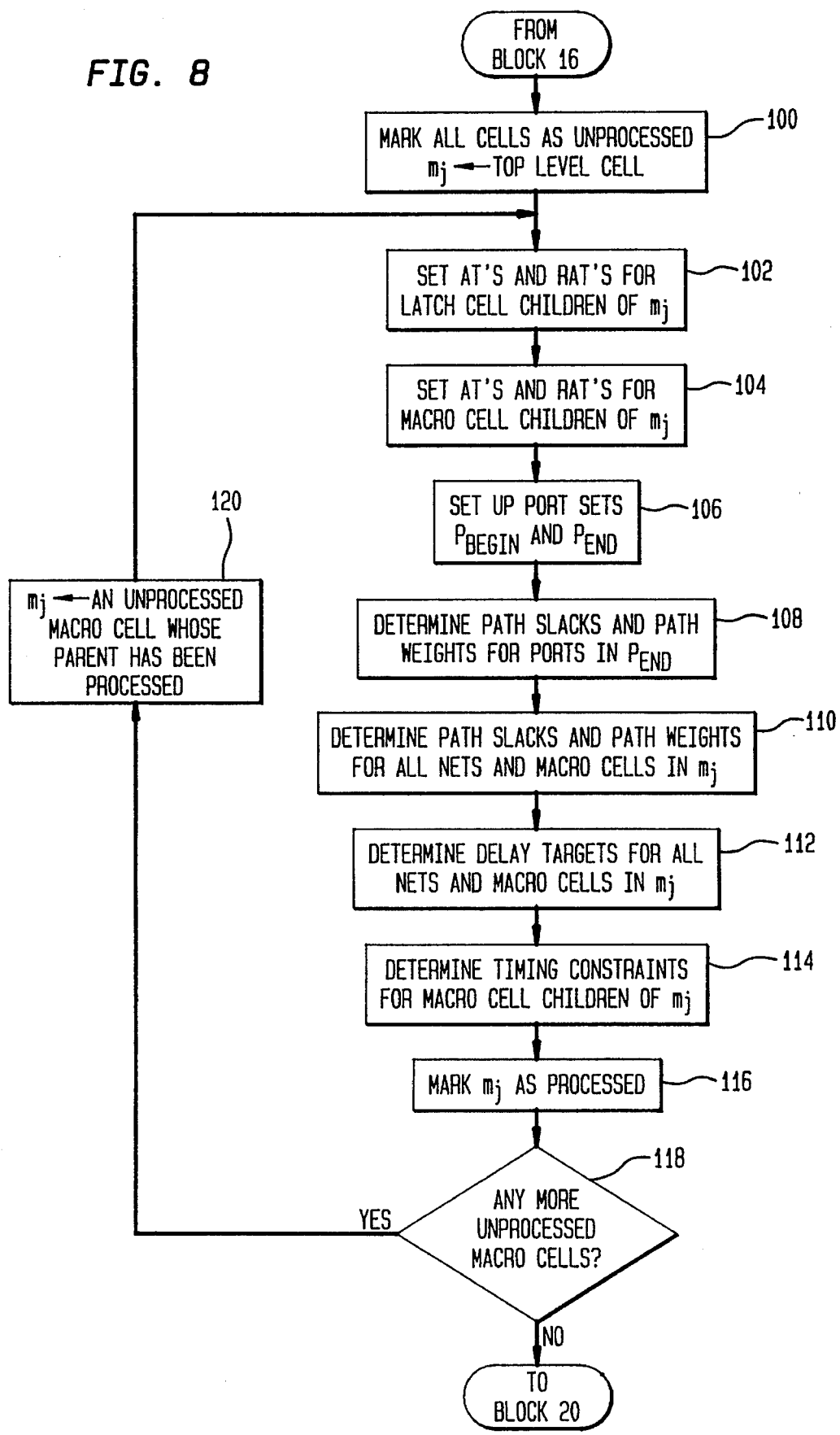
FIG. 8 is a flowchart illustrating generation of delay targets for nets and macro cells in accordance with block 18 of FIG. 1.

Reference is now made to FIG. 8, which provides a detailed method of generating delay targets for nets and macro cells in accordance with block 18. The delay targets are generated for the individual nets and macro cells of the design based on the net measures and abstract delay models obtained from block 16 and the overall delay constraints specified for the design. At block 100, all macro cells are marked as unprocessed, and the top level macro cell in the design hierarchy will be the initial macro cell accessed and processed. The variable $m_j$ will represent the current macro cell, i.e., the macro cell being processed at any given time.

At block 102, for all child cells of $m_j$ that are latch cells and do not already have AT's and RAT's available for their output and input ports, respectively (see description of data input to the algorithm), AT's are asserted on, or stored in association with, the output ports of the cell, and RAT's are asserted on the input ports of the cell. The values of the AT's and RAT's are determined by the clocking scheme in the design and the delay constraints. Thus, for a single clock design, the RAT values are equal to the clock period, (ignoring latch setup and hold times) and the AT values are equal to zero.

At block 104, for each macro cell child of $m_j$ that has a latched input/output port, an AT is determined for each such latched output port, and a RAT is determined for each such latched input port. These are determined based on the clocking scheme, the abstract delay models of the child macro cells, and the delay constraints of the design. Thus, for a single clock design, the RAT value on a latched input port $P_i$, RAT($P_i$), is the clock period minus Delay($P_i$); the AT value on a latched output port $P_j$, AT($P_j$), is Delay($P_j$).

Next, two sets of ports, $P_{BEGIN}$ and $P_{END}$, are derived at block 106. $P_{BEGIN}$ is the set of all ports of $m_j$ and its children that have arrival time values stored or specified for them. $P_{END}$ is the set of all ports of $m_j$ and its children that have required arrival time values stored or specified for them. These two sets of ports, $P_{BEGIN}$ and $P_{END}$, will be used as the starting and ending points of delay paths, respectively, in which delay targets will be generated.

Figure 9:
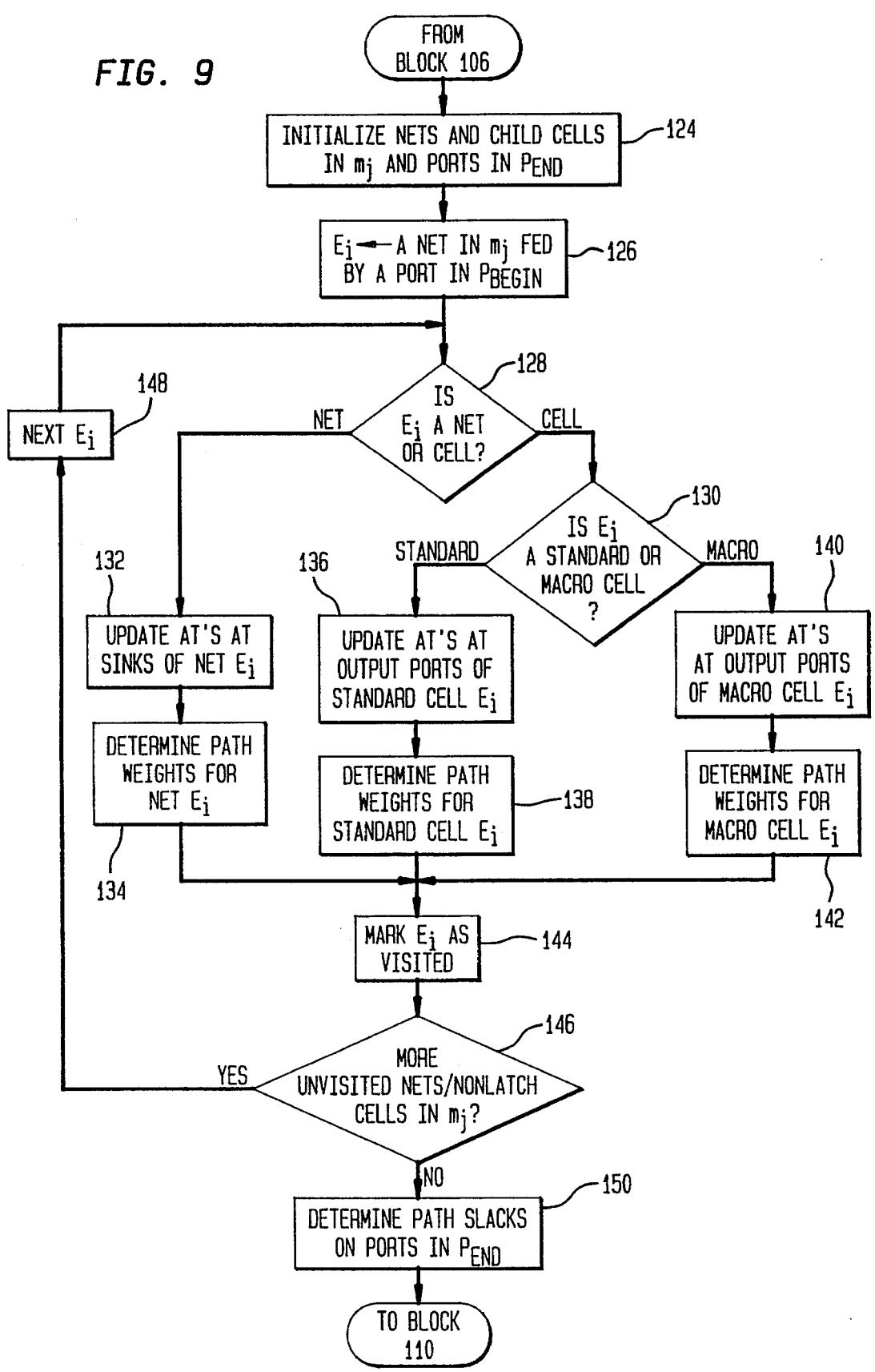
FIG. 9 is a flowchart illustrating determination of path slacks and path weights in accordance with block 108 of FIG. 8.

At block 108, path weights and path slacks are derived at the ports in $P_{END}$. This is accomplished by a "forward pass" through the nets and macro cell children in macro cell $m_j$. Preferably, the path slack and path weight for each net and each macro cell child of each macro cell is determined by setting arrival times and path weights for each net and each child cell of each macro cell based on arrival time and path weight of the nets feeding each child cell and the child cells feeding each net, wherein the path weight of a net or child cell is the sum of its net measure and the maximum path weight among the child cells or nets feeding it; and determining path slack of each net that has a required arrival time specified therefor as the difference between its arrival time and required arrival time. A detailed method of accomplishing this "forward pass" is provided in FIG. 9. Referring now to FIG. 9, at block 124, all the cells and nets in $m_j$ are initially marked as unvisited, and for each source port $P_i$ in $P_{BEGIN}$, the "path weight" of $P_i$, abbreviated as PW($P_i$), is set to zero. The "forward pass" now begins with loop parameter $E_i$ being set at block 126 to a net of $m_j$ that is fed by a port in $P_{BEGIN}$. If it is determined at block 128 that $E_i$ is a net (which must be true for the first $E_i$), then, at block 132, the signal arrival time ("AT") at each sink of the net $E_i$ is updated by adding the AT at the source node to the net measure value of the corresponding source-sink port pair. Then, at block 134, for each source/sink port pair ($P_x$, $P_y$) of the net $E_i$, the path weight PW($P_x$,$P_y$) is determined in accordance with the formula: PW($P_x$)+ NM($P_x$,$P_y$), i.e., the path weight of the source port plus the net measure (NM) associated with ($P_x$, $P_y$). Also, the path weight PW($P_y$) is set to the same value PW($P_x$,$P_y$). Note that the term PW($P_x$) or PW($P_y$) for any port $P_x$ or $P_y$, respectively, refers to the path weight value associated with the port $P_x$ or $P_y$, respectively, whereas, the term PW($P_x$,$P_y$) for any port pair, $P_x$,$P_y$, refers to the path weight value associated with the port pair $P_x$,$P_y$.

If it is determined at block 128 that $E_i$ is a cell, and then determined at block 130 that $E_i$ is a standard cell, then, at block 136, the AT's at the output ports of the cell $E_i$ are updated based on the AT's at the input ports of $E_i$ using the delay model specified for the standard cell $E_i$. Next, at block 138, for each connected input/output port pair $(P_x, P_y)$ of the cell $E_i$ for which the delay model of $E_i$ contains a delay segment (which indicates that a signal can be fed or propagated from $P_x$ to $P_y$ so that the output signal at $P_y$ can be influenced by the input signal at $P_x$), the path weight $PW(P_x,P_y)$ is set equal to $PW(P_x)$. Also, for each such output port $P_y$, the path weight $PW(P_y)$ is set to the maximum value of $PW(P_x,P_y)$ for all input ports $P_x$ of the cell $E_i$ connected to $P_y$ by a delay segment.

If it is determined at block 128 that $E_i$ is a cell, and then determined at block 130 that $E_i$ is a macro cell, then, at block 140, the AT's at the output ports of the cell $E_i$ are updated based on the AT's at the input ports of $E_i$ using the abstract delay model constructed earlier for cell $E_i$. Next, at block 142, for each input/output port pair $(P_x, P_y)$ of cell $E_i$ for which the delay model of $E_i$ contains a delay segment (which indicates that a signal can be propagated from $P_x$ to $P_y$), the path weight $PW(P_x,P_y)$ is set to $PW(P_x)+NM(P_x,P_y)$, where $NM(P_x,P_y)$ is the net measure value associated with the delay segment. Also, for each such output port $P_y$, the path weight $PW(P_y)$ is set to the maximum value of $PW(P_x, P_y)$ for all input ports $P_x$ of cell $E_i$ connected to $P_y$ by a delay segment.

The element $E_i$ is then marked as visited at block 144. At block 146, a determination is made as to whether there are more net or non-latch cell elements in $m_j$ that have not yet been visited. If there are such elements that have not yet been visited, then, at block 148, another element $E_i$ (net or non-latch cell) is accessed or selected that has not yet been visited such that all elements feeding it have already been visited, and the procedure returns to block 128. Thus, a net is selected only when the cell (if any) connected to its source port has been visited, and a cell is visited only when all the nets connected to its input ports have been visited.

If it is determined at block 146 that all net and non-latch cell elements in $m_j$ have been visited, then all nets and cells in $m_j$ have been processed. Subsequently, at block 150, for each port $P_y$ in $P_{END}$, the "path slack" of $P_y$, abbreviated as $PS(P_y)$, is set to $RAT(P_y)-AT(P_y)$, i.e., the difference between the required arrival time at $P_y$ (based on the clocking scheme and delay constraints on the design) and the actual signal arrival time at $P_y$. Note that the term $PS(P_x)$ or $PS(P_y)$ for any port $P_x$ or $P_y$, respectively, refers to the path slack value associated with the port $P_x$ or $P_y$, respectively, whereas, the term $PS(P_x,P_y)$ for any port pair, $P_x,P_y$, refers to the path slack value associated with the port pair $P_x,P_y$.

As such, a "forward pass" has been completed through the elements of $m_j$, and path weight and path slack values have been determined and assigned to the ports of $m_j$ and its children that belong to $P_{END}$. Referring again to FIG. 8, the procedure then continues to block 110. At block 110, a "backward pass" is carried out on the design from ports in $P_{END}$ toward ports in $P_{BEGIN}$, during which path slack values and revised path weight values are assigned to each port visited. Preferably, determining path slack and path weight for each net and child cell is based on the path slack and path weight of the child cells and nets fed by the net, wherein the path slack of a net is the minimum path slack among the child cells fed by the net, and wherein the path weight of a net is the maximum path weight among the child cells fed by the net, and wherein the path slack of a child cell is the minimum path slack among the or nets fed by the child cell, and wherein the path weight of a child cell is the maximum path weight among the nets fed by the child cell. A detailed method of accomplishing this "backward pass" is provided in FIG. 10.

Figure 10:
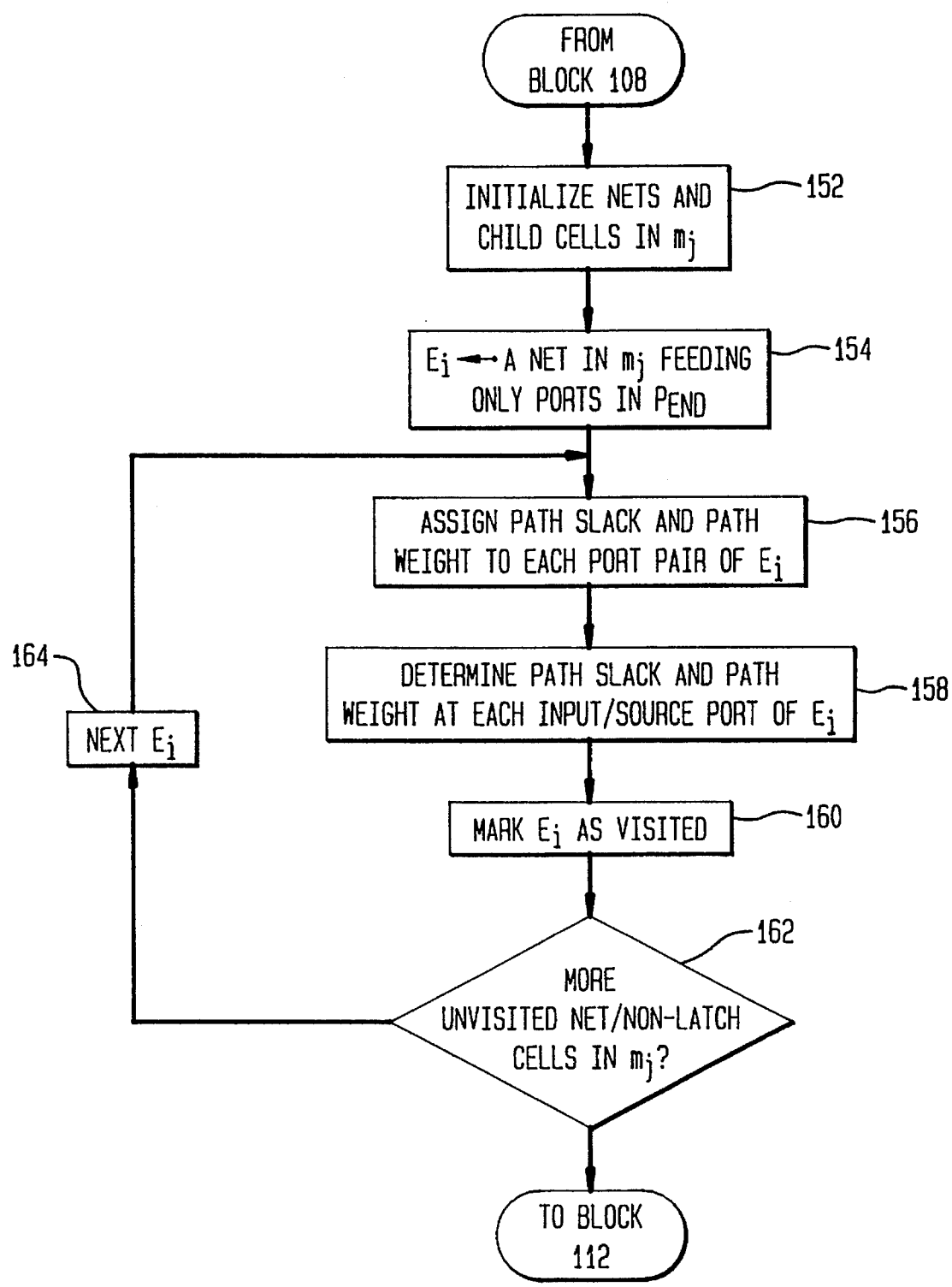
FIG. 10 is a flowchart illustrating determination of path slacks and path weights in accordance with block 110 of FIG. 8.

With reference now to FIG. 10, each net and child cell of $m_j$ is initially marked as unvisited at block 152. At block 154, prior to proceeding with the iterative loop explained below, a net of $m_j$ that feeds only ports in $P_{END}$ is selected, and denoted as element $E_i$. In each iteration of the loop, element $E_i$ is either a cell or a net entity within $m_j$. At block 156, for each port pair $(P_x, P_y)$ of element $E_i$, where $P_x/P_y$ is either an input/output port pair connected by a delay segment (if element $E_i$ is a cell), or a source/sink port pair (if element $E_i$ is a net), an operation is carried out as follows: the path slack $PS(P_x,P_y)$ is set to $PS(P_y)$ and the path weight $PW(P_x,P_y)$ is set to $PW(P_y)$. Next, at block 158, for each port $P_x$ that is an input port (if element $E_i$ is a cell) or a source port (if element $E_i$ is a net), the following operation is carried out: the path slack value $PS(P_x)$ is set to the minimum value of $PS(P_x,P_y)$ among all output/sink ports $P_y$ of element $E_i$ connected to $P_x$, and the path weight value $PW(P_x)$ is set to the maximum value of $PW(P_x,P_y)$ among all output/sink ports $P_y$ of element $E_i$ connected to $P_x$. Finally, at block 160, element $E_i$ is marked as visited, and if it is determined at block 162 that there are more unvisited non-latch elements $E_i$, then another unvisited net or non-latch cell element $E_i$ is selected at block 164 such that all non-latch cell or net elements that it feeds are already visited, and the loop is repeated. At the end of the iteration, path slacks and path weights have been determined for all nets and macro cells in $m_j$.

Next, referring again to FIG. 8, at block 112, delay apportionment is now carried out. For each port pair $(P_x, P_y)$ corresponding to a source/sink pair of a net or an input/output pair of a macro cell connected by a delay segment, the delay apportioned to the port pair $(P_x, P_y)$ is determined as: $NM(P_x,P_y)+[NM(P_x,P_y)* PS(P_x,P_y)/PW(P_x,P_y)]$. The resulting values are the desired delay targets for the nets and macro cells at the current hierarchy level.

In order to be able to generate delay targets for lower hierarchy levels, delay constraints are needed for the macro cells in the same form as they were provided by the user for the top-level cell. These delay constraints take the form of AT's and RAT's at the inputs and outputs of each macro cell, respectively. These AT's and RAT's are generated at block 114 based on well-established static timing analysis methods, such as described by R. B. Hitchcock, Sr., G. L. Smith and D. D. Cheng, in "Timing Analysis of Computer Hardware", IBM Journal of Research & Development, Vol. 26, No. 1, January 1982, pp. 100–105. Generally, in accordance with these static timing analysis methods, the AT's at the input ports of the current hierarchy level are propagated forward in a levelized fashion towards the macro cell input ports, adding on the delays that the signals encounter on the way. For nets and macro cells the delay targets previously determined are used, and for standard cells the prespecified delay models are used. The RAT's are propagated backwards in a similar way from the outputs ports of the current hierarchy level towards the macro cell output ports, this time subtracting the delays encountered on the way. The AT's and RAT's determined in this way on the macro input and output ports, respectively, are asserted as the delay constraints on the macros.

Subsequently, at block 116, $m_j$ is marked as having been processed. At block 118, if it is determined that there are macro cells that have not yet been processed, then another macro cell $m_j$ is selected at block 120 that has delay constraints already asserted on its ports but for which internal delay targets have not yet been determined, and the procedure loops back to block 102.

The result of block 18 in FIG. 3 is a design hierarchy in which delay targets have been generated for all nets and macro cells in the hierarchy. These targets can then be used for target-driven physical design processes such as floorplanning, placement and wiring. The delay targets can also be converted into capacitance, resistance and/or wire length targets depending on the needs of the physical design programs. These conversions are straight-forward and essentially consist of computing capacitance/resistance/wire length values for each net that result in equivalent delay values associated with the net delay targets. See, for example, the Luk paper. If the physical design process is able to successfully meet all the delay targets, the design will meet its delay constraints. This follows from the proof of correctness of the technique presented in the Youssef and Shragowitz paper; and the method illustrated herein is an extension or improvement of the technique presented in the Youssef and Shragowitz paper.

The steps covered by blocks 100 through 162 illustrate the extension or improvement of the non-hierarchical target generation algorithm presented in the Youssef and Shragowitz paper. However, the steps in accordance with the invention can be modified so as to be an extension or improvement of other non-hierarchical target generation algorithms, such as the one presented in the Luk paper. Generally speaking, irrespective of the details of the specific algorithm used for carrying out the apportionment of delays to nets and cells, in accordance with the present invention, (1) apportioning is carried out simultaneously on nets and hierarchical macro cells, and (2) a net measure is used to uniformly determine the relative delay "demand" between nets as well as macro cells.

Generally speaking, physical design programs are not always able to meet the delay targets on every single net in the design. This applies to the prior art (when applied to non-hierarchical designs) as well as the present invention. However, the violation of a delay target on a particular net may be compensated for by another net whose actual delay is well within the delay target. Thus the design may be able to meet the overall delay constraints even if each individual delay target is not met.

The delay targets generated by any target generation method are generally sufficient for the design to meet its constraints. However, for designs that are tightly constrained by timing requirements, it is general practice among designers to carry out several iterations of the target generation process to "loosen" some of the individual delay targets that are less critical while still guaranteeing that they are sufficient to meet the overall delay constraints. In each iteration, instead of computing the net measures from scratch, the delay targets determined in the previous iteration are used as the net measures at block 54. Thus the existing delay targets are taken into account in the computation of path slacks and path weights at blocks 108 and 110. The calculation at block 112 now becomes an adjustment to the current net delay target (rather than an absolute delay value), and is added to the current net delay target. Prior experience shows that approximately 4 to 5 iterations are generally sufficient for the targets to converge to values that are nearly as "loose" as possible while guaranteeing timing correctness (see the Youssef and Shragowitz paper).

Thus, in accordance with the invention, apportionment is performed on both nets and macro cells as the entities to which R/C/RC are to be apportioned, and the apportionment on the various entities is biased by using a weightage for each net and macro cell equal to the associated net measure.

Note that nets and macro cells are both treated as uniform entities in the latter step of the loop; i.e., slack is distributed among both nets and macro cells at the same time. This is in direct contrast to the traditional approach, in which the cells are treated as predesigned entities with known timing behavior, which can therefore not be used in a top-down hierarchical design methodology.

The net targets generated by the present invention can be used by a timing-driven floorplanner to carry out a floorplanning process on the top level of the design. Subsequently, the procedure in accordance with the invention can be invoked recursively on each macro cell to generate targets on the lower-level nets and cells and then run timing-driven floorplanning/placement on the lower level entities. Thus, the hierarchical target generation solution presented here makes it possible to carry out a true top-down hierarchical timing-driven design methodology, where net length constraints are propagated bottom-up in the form of net measures and timing targets are propagated top-down as the design methodology proceeds.

Further, the solution proposed here is able to work with hierarchical designs because: (i) at each level of the hierarchy it can apportion capacitance and delay between both nets and macro cells, since both are entities to be designed in a hierarchical methodology; (ii) it predicts and takes into account the expected net lengths at lower hierarchy levels inside the macro cells and uses this information to intelligently apportion targets at upper hierarchy levels.

By way of explanation, and without limitation to the present invention, the definition of net measure can be modified so that the net measure value of a net reflects not only the delay of the net but also the portion of the delay of the cell driving it that is caused by the capacitive loading effect of the net. In this case the procedure of blocks 24 and 42 would be modified accordingly for computing net measures, as well as the procedure at block 112 for apportioning delays to nets. At block 112, the new net measure apportioned to a net would reflect the sum of the net delay and the load-dependent delay of the cell feeding it. This extension of the method would make it sensitive to variations in cell delays due to the capacitive loading of the nets themselves.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of generating delay targets for creating a multilevel hierarchical circuit design, comprising the steps of:

(a) providing a hierarchical design description and delay constraints of the multilevel hierarchical circuit design, wherein the hierarchical design description describes the interrelationship between cells, including macro cells, input/output ports, and nets in the mutilevel hierarchical design;

(b) generating a net measure for each net and macro cell of the multilevel hierarchical circuit design and generating an abstract delay model for each macro cell of the multilevel hierarchical circuit design based on the hierarchical design description, wherein net measure is the estimated resistive-capacitive delay of a net derived from the estimated length of the net based on area-driven design, and an abstract delay model is a description of delays through a macro cell;

(c) generating delay targets for the nets and macro cells based on net measures, the abstract delay models and the delay constraints; and (d) creating the multilevel hierarchical circuit design based on said delay targets.

2. A method according to claim 1, wherein step (b) comprises the steps of:

(e) determining the net measure of each net in the multilevel hierarchical circuit design;

(f) determining delay of the longest delay path, if any, from the input port to the output port for each paired input/output port of each macro cell in the multilevel hierarchical circuit design;

(g) determining the net measure of each said longest delay path; and (h) determining delay and net measure for each input and output port of each macro cell;

wherein the abstract delay model for each macro cell comprises the delays determined for the macro cell in steps (f) and (h).

3. A method according to claim 2, wherein, if a net has a known path, then step (e) comprises using estimated resistive-capacitive delay for said known path for determining net measure of the net.

4. A method according to claim 2, wherein, if a net does not have a known path, but the net has end-points that are fixed, then step (e) comprises using estimated resistive-capacitive delay based on a Steiner tree topology for said known path for determining net measure of the net.

5. A method according to claim 2, wherein, if a net does not have a known path, and the net has end-points that are not fixed, but the net has a specified net measure, then step (e) comprises accessing the specified net measure for the net and using the specified net measure.

6. A method according to claim 2, wherein, if a net does not have a known path, and the net has end-points that are not fixed in location, and the net does not have a specified net measure, then step (e) comprises determining an estimated average connection length for the net and determining net measure for each source/sink pair of the net using estimated resistive-capacitance delay for said estimated average connection length for determining net measure of the net.

7. A method according to claim 2, wherein step (h) comprises the steps of:

determining delay of the longest delay path, if any, from each input port to a latch within the macro cell, and delay of the longest delay path to each output port from a latch within the macro cell; and determining net measure of each said longest path delay.

8. A method according to claim 1, wherein step (c) comprises the steps of:

(i) setting an arrival time and a required arrival time for each port of each latch cell child and each port of each macro cell child of each macro cell that has a path to or from a latch within the macro cell;

(j) determining path slack and path weight for each port and each child cell of each macro cell that has a required arrival time specified therefor;

(k) determining path slack and path weight for each net and each child cell of each macro cell;

(l) determining a delay target for each net and each macro cell child of each macro cell; and (m) determining timing constraints for each macro cell child of each macro cell.

9. A method according to claim 8, wherein step (i) comprises setting an arrival time and a required arrival time for each macro cell child based on clocking scheme and delay constraints of the multilevel hierarchical circuit design.

10. A method according to claim 8, wherein step (j) comprises the steps of:

(n) setting arrival times and path weights for each net and each child cell of each macro cell based on arrival time and path weight of the nets feeding each child cell and the child cells feeding each net, wherein the path weight of a net or child cell is the sum of its net measure and the maximum path weight among the child cells or nets feeding it; and (o) determining path slack of each net that has a required arrival time specified therefor as the difference between its required arrival time and arrival time.

11. A method according to claim 8, wherein step (k) comprises determining path slack and path weight for each net and child cell based on the path slack and path weight of the child cells and nets fed by the net, wherein the path slack of a net is the minimum path slack among the child cells fed by the net, and wherein the path weight of a net is the maximum path weight among the child cells fed by the net, and wherein the path slack of a child cell is the minimum path slack among the nets fed by the child cell, and wherein the path weight of a child cell is the maximum path weight among the nets fed by the child cell.

12. A method according to claim 8, wherein the timing constraints at step (m) comprise arrival times and required arrival times for the macro cells generated based on static timing analysis.

* * * * *